(12) United States Patent
Lo et al.

(10) Patent No.: US 6,279,464 B1
(45) Date of Patent: Aug. 28, 2001

(54) COOKING APPLIANCE

(75) Inventors: Hou On Lo, Kowloon; Yee Koo Chen, Tai Po, N.T., both of (CN)

(73) Assignee: Front Direction Industrial Limited, Hong Kong (CN)

( * ) Notice: Subject to any disclaimer, the term of this patent is extended or adjusted under 35 U.S.C. 154(b) by 0 days.

(21) Appl. No.: 09/670,300

(22) Filed: Sep. 26, 2000

(30) Foreign Application Priority Data

Aug. 15, 2000 (GB) .................................................. 0020081

(51) Int. Cl.[7] .................................. A23L 1/00; A47J 37/00

(52) U.S. Cl. .................................. 99/331; 99/348; 99/352; 99/357; 99/455; 99/468; 99/476; 99/483; 99/486; 99/517; 219/400

(58) Field of Search ............................ 99/276, 331, 348, 99/451, 455, 467, 357, 468, 470, 472, 352, 476–479, 483, 355, 486, 517, 493, 506, 534, 535, 286.1, 289.1; 435/289–291, 313, 316, 69.1, 172.1, 300.1, 813, 819; 426/49, 52, 231, 615; 165/64, 263, 918; 62/229, 157, 187, 115; 219/385, 386, 400, 401

(56) References Cited

U.S. PATENT DOCUMENTS 5,771,788 * 6/1998 Lee et al. .................................. 99/468

* cited by examiner

Primary Examiner—Timothy F. Simone
(74) Attorney, Agent, or Firm—Alix, Yale & Ristas, LLP

(57) ABSTRACT

A cooking appliance (100) comprising a housing (10) providing a cooking chamber (12), a cooking mechanism associated with the cooking chamber (12) for cooking food therein, and a peltier unit (20) arranged to alter the temperature of the interior of the cooking chamber (12). The peltier unit (20) comprises a peltier device (30) having first and second metal parts which form a junction therebetween and are associated with the interior and exterior of the cooking chamber (12) respectively. In a cooling mode, the peltier device (30) is operable to, upon the passage of an electrical current across the junction in one direction, absorb heat by the first metal part and liberate heat by the second metal part, such that the interior temperature of the chamber (12) may be lowered to facilitate the storage of perishable food. In a heating mode, the peltier device (30) is operable to, upon the passage of an electrical current across the junction in the reverse direction, absorb heat by the second metal part and liberate heat by the first metal part, such that the interior temperature of the chamber (12) may be raised for the purpose of keeping cooked food warm.

11 Claims, 1 Drawing Sheet

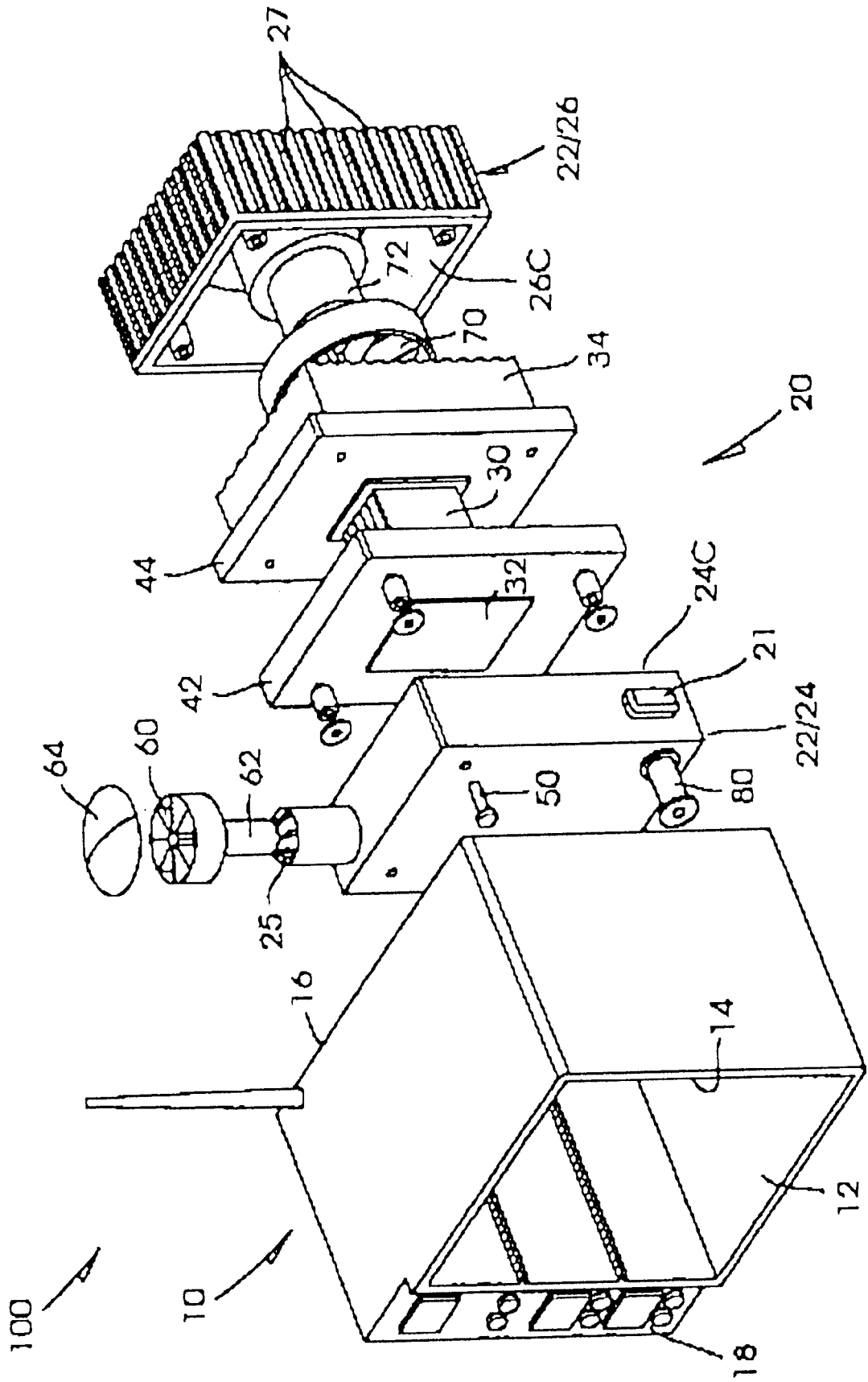

COOKING APPLIANCE

BACKGROUND OF THE INVENTION

1. Field of the Invention

The present invention relates to a cooking appliance which is also capable of keeping food or ingredients for making food fresh.

2. Description of the Related Art

Food related appliances designed to either keep food cold for storage or heat food to cooking temperatures are well known. Some appliances are intended to cook food and then keep the food hot. Other appliances may be intended to keep pre-cooked food warm, e.g., hot plate, chafing dishes, etc.

Many cooking appliances have timers that allow the appliance to start and cook food according to a pre-set schedule. For example, a microwave oven that has a timer allowing the microwave to be set before the owner leaves for work in the morning. Such an appliance presents the hazard that any perishable ingredient included in the microwave remains at room temperature all day and is subject to bacterial growth. As a result, the owner is limited to non-perishable ingredients or a limited lead-time to prevent spoilage.

SUMMARY OF THE INVENTION

According to one aspect of the invention, there is provided a cooking appliance having a housing providing a cooking chamber, a cooking mechanism associated with the chamber for cooking food therein, and a peltier unit arranged to alter the temperature of the interior of the chamber. The peltier unit comprises a solid-state refrigeration/heating unit including first and second heat conducting parts. The peltier device relies on the peltier effect, a known heat moving effect of electric current passing through certain types of semiconductor junctions. As used in this application, the term peltier device refers to a known, self contained semi-conductor device with the capability to absorb or radiate heat from opposed thermally conductive parts, depending on the direction of electric current passing through the device. The heat conducting parts are preferably constructed of metal, due to the excellent thermal conductivity of metals, but other materials may be substituted. The first heat conducting part is arranged near the cooking chamber, while the second heat conducting part is separated from the cooking chamber and arranged at an opposed side of the peltier device. A semiconductor junction is formed between the heat conducting parts.

The peltier device may be operated to, upon the passage of an electrical current across the semiconductor junction in one direction, absorb heat from the first heat conducting part and liberate heat by the second heat conducting part.

The first heat conducting part is preferably arranged in a sub-chamber near the cooking chamber. A fan may be arranged to pass ambient air over the heated or cooled first heat conducting part. A passage is preferably provided to communicate the heated or cooled air to the cooking chamber.

In this manner the temperature of the cooking chamber may be lowered to a temperature between 0° and 4° C. for food storage or, with a reverse flow of an electrical current through the peltier device, raised to a temperature of 70° C. to keep food warm following cooking or assist in the cooking process.

Preferably, the peltier unit includes a heat transfer chamber having an interior to which the first metal part of the peltier device is exposed, said heat transfer chamber being in thermal communication with the cooking chamber.

More preferably, the heat transfer chamber is provided with a motor driven fan for driving air therefrom into the cooking chamber.

More preferably, the peltier unit has a casing providing the heat transfer chamber, said casing being separated from the cooking chamber but connected thereto by means of a passage to enable thermal communication between the two chambers.

In a preferred embodiment, the peltier unit includes a first heat-exchanging member in contact with the first metal part of the peltier device to facilitate the absorption and liberation of heat.

More preferably, the peltier unit further includes a heat transfer chamber having a wall which is formed with an aperture for receiving the first metal part of the peltier device, wherein the first heat exchanging member is mounted within the heat transfer chamber.

In a preferred embodiment the peltier unit further includes a second heat-exchanging member in contact with the second metal part of the peltier device to facilitate the absorption and liberation of heat from the second metal part.

More preferably, the peltier unit further includes a motor-driven fan arranged to drive air past the second heat-exchanging member to facilitate the absorption and liberation of heat from the second heat-exchanging member.

It is preferred that the peltier unit further includes a support formed with an aperture for receiving and locating the peltier device in position, said support having opposite sides on which the first and second heat exchanging members are mounted.

More preferably, the support is formed by a pair of parallel walls formed with respective apertures receiving the first and second metal parts of the peltier device, said walls having opposite outer sides on which the first and second heat exchanging members are mounted.

An object of the present invention is to provide a new and improved cooking appliance that can cool the cooking chamber sufficiently to store perishable ingredients therein until cooking.

Another object of the present invention is to provide a new and improved cooking appliance that will permit the delayed preparation of foods including perishable ingredients.

BRIEF DESCRIPTION OF THE DRAWING

The invention will now be more particularly described, by way of example only, with reference to the accompanying drawing, which is an exploded front, right side and top perspective view of a preferred embodiment of a cooking appliance in accordance with the invention.

DETAILED DESCRIPTION OF THE PREFERRED EMBODIMENTS

Referring to the drawing, there is shown a cooking appliance 100 embodying the invention, which appliance 100 has a rectangular box-like housing 10 providing a cooking chamber 12 and includes an internal cooking mechanism (not shown) for cooking food or food-making ingredients deposited in the cooking chamber 12. The housing 10 has an open front side 14 and a closed rear side 16, of which the front side 14 is provided with a hinged door (not shown) for closing the cooking chamber 12. The left side of the appliance includes a control panel 18 having a programmable timer for controlling the operation of the cooking mechanism. The appliance 100 includes a peltier unit 20 that has a main switch 21 and is also controlled by means of the control panel 18.

The peltier unit 20 has a rectangular box-like casing 22 formed by a pair of hollow front and rear parts 24 and 26. The front casing part 24 has solid walls for defining an enclosed chamber 24C that has an opening 25 through the uppermost wall. The rear casing part 26 has walls formed with slots 27 to define an open chamber 26C.

The peltier unit 20 incorporates an internal peltier device 30 which includes first and second metal thermal plates 32, 34 connected together by a semiconductor junction (as generally known in the art). A peltier device appropriate for use in conjunction with the present invention is available from a few specialty component manufacturers in China, Germany and the United States. The peltier device consumes 12 VDC (direct current) electricity at a current flow of 3 to 8 amps to produce a temperature differential of 70° C. between the opposed heat conducting parts. Peltier devices appropriate for use with a range of appliances in accordance with the present invention are available in power ratings from 25 to 300 watts.

The first and second metal plates are preferably constructed of copper or aluminum due to the superior thermal and electrical conductivity of these materials.

The peltier device 30 is located in position by a pair of front and rear vertical walls 42 and 44 lying close together. The two walls 42 and 44 are formed with respective central apertures receiving the front and rear parts of the peltier device 30, thereby together forming a support for the overall device 30.

The first metal thermal plate 32 is mounted centrally on the outer side of the front wall 42, which is in connection or contact with the front end of the peltier device 30. Mounted centrally on the outer side of the rear wall 44 is the second metal thermal plate 34, which is in connection or contact with the rear end of the peltier device 30. Both thermal plates 32 and 34 are employed for heat exchanging in order to facilitate the absorption and liberation of heat by the front and rear parts of the peltier device 30 during operation. The first thermal plate 32 is relatively much smaller and thinner than the second thermal plate 34.

The front and rear casing parts 24 and 26 are connected together, with the two walls 42 and 44 sandwiched between them, by means of four screws 50 at the corners. The front casing part 24 is closed on its rear side by the front wall 42 to form the complete heat transfer chamber 24C, in which the first thermal plate 32 is contained. As the first thermal plate 32 is located on an inner surface of the heat transfer chamber 24C, it is exposed to the interior of the heat transfer chamber 24C. The rear casing part 26 is closed on its front side by the rear wall 44 to form the complete exhaust chamber 26C, in which the second thermal plate 34 is contained.

A fan 60 driven by an electric motor 62 is supported at the opening 25 of the heat transfer chamber 24C for driving ambient air into the heat transfer chamber 24C and over the first thermal plate 32. A mesh-like cover 64 protects the fan 60. The exhaust chamber 26C is also provided with an internal fan 70 driven by an electric motor 72. The fan is supported in the rear casing part 26, for driving ambient air past the second thermal plate 34 contained in the exhaust chamber 26C. Ambient air freely enters and exits the exhaust chamber 26C through the slots 27.

The peltier unit 20 is provided with thermal communication to the cooking chamber 12 of the cooking appliance 100 by means of a tubular coupler 80. The tubular coupler 80 has opposite ends connected to the front wall of the peltier unit casing 22 and the rear side 16 of the cooking chamber, respectively.

The coupler 80 provides a passage to enable thermal communication between the heat transfer chamber 24C and the cooking chamber 12, such that the ambient air driven by the fan 60 past the first thermal plate 32 may then pass into the cooking chamber 12.

The peltier unit 20 has two modes of operation, namely cooling and heating modes, which are selectable by means of the control panel 18. In the cooling mode, the peltier device 30 is operable to, upon the passage of an electrical current across its junction in one direction, absorb heat from the first thermal plate 32 and liberate heat by the second thermal plate 34. As a result, the air driven through the peltier unit heat transfer chamber 24C into the cooking chamber 12 is cooled, thereby lowering the interior temperature of the cooking chamber 12 for keeping food contained therein fresh. The temperature of the cooking chamber is lowered to a temperature between 0° and 40° C. to prevent bacterial growth.

In the heating mode, the peltier device 30 is operable to, upon the passage of an electrical current across its junction in the reversed direction, absorb heat from the second thermal plate 34 and liberate heat by the first thermal plate 32. As a result, the air driven through the peltier unit heat transfer chamber 24C into the cooking chamber 12 is heated, thereby raising the interior temperature of the cooking chamber 12 to assist cooking of food contained therein by the aforesaid cooking mechanism. This heating function may also be used to keep food warm after cooking. Using the peltier device alone, the temperature of the cooking chamber can be raised to a temperature of approximately 70° C.

Food stored in the cooking chamber 12, can be kept fresh by the cooling function of the peltier unit 20 until it is cooked at a later time preset by means of the control panel 18. The hazards of spoilage are much reduced and the possible delayed cooking time extended considerably. In the cooling mode, the peltier unit 20 converts a conventional cooking appliance, such as a microwave or heater-based oven (as shown) or rice cookers, into a cold storage container like a refrigerator. An appliance so equipped can be used even when it is not cooking, or prior to the start of actual cooking, for containing and keeping the freshness of perishable food or food-making ingredients.

It is envisaged that the peltier unit of the subject invention may be built into a cooking appliance, sharing the same housing. In a simplified embodiment, the front thermal plate 32 may be provided physically within the cooking chamber 12, located on an inner surface thereof, for direct action. In that case, the fan 60 may be omitted.

The invention has been given by way of example only, and various other modifications of and/or alterations to the described embodiment may be made by persons skilled in the art without departing from the scope of the invention as specified in the appended claims.

What is claimed is:

1. A cooking appliance comprising a housing providing a cooking chamber, a cooking mechanism associated with the cooking chamber for cooking food therein, and a peltier unit arranged to alter the temperature of the interior of the cooking chamber, said peltier unit comprising a peltier device constructed by first and second metal parts which form a junction therebetween and are associated with an interior and exterior of the cooking chamber respectively, whereby the peltier device is operable to, upon the passage of an electrical current across the junction in a first direction, absorb heat by the first metal part and liberate heat by the second metal part such that the temperature within the cooking chamber may be lowered to prevent spoilage of food deposited in the cooking chamber.

2. The cooking appliance of claim 1, wherein said peltier device is operable to, upon the passage of an electrical current across the junction in a second direction, absorb heat by the second metal part and liberate heat by the first metal part such that the temperature within the cooking chamber interior may be raised.

3. The cooking appliance as claimed in claim 1, wherein the peltier unit includes a heat transfer chamber having an interior to which the first metal part of the peltier device is exposed, said heat transfer chamber being in communication with the cooking chamber.

4. The cooking appliance as claimed in claim 3, wherein the heat transfer chamber is provided with a motor-driven fan for driving air therefrom into the food chamber.

5. The cooking appliance as claimed in claim 2, wherein the peltier unit has a casing providing a heat transfer chamber, said casing including a wall separating the heat transfer chamber from the cooking chamber, the wall having a coupler providing a passage to enable thermal communication between the heat transfer and cooking chambers.

6. The cooking appliance as claimed in claim 1, wherein the peltier unit includes a first heat exchanging member which is in contact with the first metal part of the peltier device to facilitate the absorption and liberation of heat by said first metal part.

7. The cooking appliance as claimed in claim 6, wherein the wall includes an aperture for mounting the first metal part of the peltier device and the first heat exchanging member is located within said heat exchanging chamber.

8. The cooking appliance as claimed in claim 6, wherein the peltier unit further includes a second heat exchanging member which is in contact with the second metal part of the peltier device to facilitate the absorption and liberation of heat by said second metal part.

9. The cooking appliance as claimed in claim 8, wherein the peltier unit further includes a motor-driven fan arranged to drive air past the second heat exchanging member.

10. The cooking appliance as claimed in claim 8, wherein the peltier unit further includes a support formed with an aperture receiving and locating the peltier device in position, said support having opposite sides on which the first and second heat exchanging members are mounted.

11. The cooking appliance as claimed in claim 10, wherein the support is formed by a pair of parallel support walls formed with respective apertures for receiving the first and second metal parts of the peltier device, said support walls having opposed outer surfaces on which the first and second heat exchanging members are mounted.

* * * * *